(12) United States Patent
Hirasawa

(10) Patent No.: US 9,707,792 B2
(45) Date of Patent: Jul. 18, 2017

(54) COOLING DEVICE, LASER DEVICE, AND IMAGE PROCESSING APPARATUS

(71) Applicant: Tomoyasu Hirasawa, Kanagawa (JP)

(72) Inventor: Tomoyasu Hirasawa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/995,718

(22) Filed: Jan. 14, 2016

(65) Prior Publication Data

US 2016/0211636 A1    Jul. 21, 2016

(30) Foreign Application Priority Data

Jan. 21, 2015   (JP) ................. 2015-009508

(51) Int. Cl.
| | |
|---|---|
| H01S 3/04 | (2006.01) |
| B41M 7/00 | (2006.01) |
| H01S 5/024 | (2006.01) |
| H01S 5/068 | (2006.01) |
| H01S 5/06 | (2006.01) |

(52) U.S. Cl.
CPC ............ B41M 7/0009 (2013.01); H01S 3/04 (2013.01); H01S 5/02407 (2013.01); H01S 5/06804 (2013.01); H01S 5/0617 (2013.01)

(58) Field of Classification Search
CPC ........ H01S 3/04; H01S 3/0014; H01S 3/0404; H01S 5/02407; H01S 5/06804; H01S 5/0617; B41M 7/0009; H05K 7/20209; H05K 7/20281
See application file for complete search history.

(56) References Cited

U.S. PATENT DOCUMENTS

| | | | | |
|---|---|---|---|---|
| 2006/0121421 | A1* | 6/2006 | Spitaels | G06F 1/206 434/118 |
| 2006/0269307 | A1* | 11/2006 | Funabiki | G03G 15/2064 399/45 |
| 2012/0070180 | A1* | 3/2012 | Iijima | G03G 21/206 399/92 |
| 2013/0141512 | A1* | 6/2013 | Asai | B41J 2/4753 347/262 |

FOREIGN PATENT DOCUMENTS

| | | |
|---|---|---|
| JP | 11-151856 | 6/1999 |
| JP | 2000-136022 | 5/2000 |
| JP | 2006-035683 | 2/2006 |
| JP | 2007-076122 | 3/2007 |

* cited by examiner

*Primary Examiner* — Manish S Shah
*Assistant Examiner* — Yaovi M Ameh
(74) *Attorney, Agent, or Firm* — Oblon, McClelland, Maier & Neustadt, L.L.P.

(57) ABSTRACT

A cooling device including a cooling controller cools a laser light source in a laser device. The laser light source irradiates a medium with a laser beam. The cooling controller controls a cooling operation according to data associated with a heating state of a laser light source in the laser device.

10 Claims, 9 Drawing Sheets

COOLING DEVICE, LASER DEVICE, AND IMAGE PROCESSING APPARATUS

CROSS-REFERENCE TO RELATED APPLICATION

This patent application is based on and claims priority pursuant to 35 U.S.C. §119(a) to Japanese Patent Application No. 2015-009508, filed on Jan. 21, 2015, in the Japan Patent Office, the entire disclosure of which is hereby incorporated by reference herein.

BACKGROUND

Technical Field

Exemplary aspects of the present disclosure generally relate to a cooling device, a laser device, and an image processing apparatus incorporating the cooling device and laser device.

Related Art

In recording and erasing an image on a thermoreversible recording medium, for example, a contact recording method is used in which a heat source heats the thermoreversible recording medium in contact with the thermoreversible recording medium.

There is market demand that an image be rewritten on such a thermoreversible recording medium without contacting the medium. Consequently, a recording and erasing method using a laser in a non-contact manner is proposed, as a method of recording and erasing an image on a thermoreversible recording medium without contacting the medium or on a thermoreversible recording medium having surface irregularities.

In a laser device that irradiates a thermoreversible recording medium with a laser beam in such a manner, a cooling device is disposed to cool the laser device, thereby stabilizing the output or wavelength of the laser light source, extending the operational life thereof. Such a cooling device cools the laser light source by a cooling process, such as an air-cooling process with a fan, a liquid-cooling process with a liquid coolant, or a cooling process using a Peltier unit.

Further, for image processing apparatuses to irradiate thermoreversible recording media with laser beams to record and erase images on and from the thermoreversible recording media, an image processing method is proposed to perform both image erasing and image recording in a single image processing apparatus (a single laser device), in consideration with cost reduction and space saving.

SUMMARY

In an aspect of this disclosure, an improved cooling device includes a cooling controller to cool a laser light source in a laser device. The laser light source irradiates a medium with a laser beam. The cooling controller controls a cooling operation of the cooling device according to data associated with a heating state of a laser light source of the laser device.

In another aspect of this disclosure, an improved laser device includes a laser light source to emit a laser beam, a cooling device to cool the laser light source, and a cooling controller. The cooling controller controls a cooling operation of the cooling device according to data associated with a heating state of the laser light source.

In still another aspect of this disclosure, an improved an image processing apparatus includes a laser light source in a laser device to emit a laser beam, a cooling device to cool the laser light source, and a cooling controller. The cooling controller controls a cooling operation of the cooling device according to data associated with a heating state of the laser light source.

The image processing apparatus has at least two operating modes of a first operating mode to irradiate a thermoreversible recording medium with a laser beam to record an image thereon, a second operating mode to irradiate a thermoreversible recording medium with a laser beam to erase an image therefrom, and a third operating mode to irradiate a thermoreversible recording medium having an image recorded with a laser beam to erase the recorded image and record another image thereon. The cooling controller controls a cooling operation of the cooling device according to the at least two operating modes.

BRIEF DESCRIPTION OF THE SEVERAL VIEWS OF THE DRAWINGS

The aforementioned and other aspects, features, and advantages of the present disclosure will be better understood by reference to the following detailed description when considered in connection with the accompanying drawings, wherein.

Figure 1:
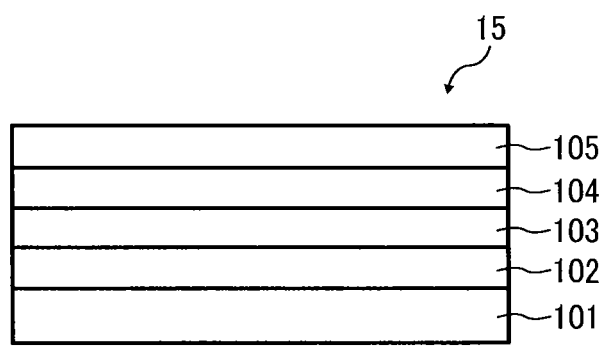
FIG. 1 is an illustration of layers of a thermoreversible recording medium.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

The thermoreversible recording medium changes a state between a colored state and a decolored state according to the heating temperature and the cooling rate after heating. Thus, the required thermal energy differs between image recording and image erasing Further, when the thermoreversible recording medium is excessively heated up, the durability of the thermoreversible recording medium decreases. Accordingly, it is preferable to apply a suitable amount of thermal energy to the thermoreversible recording medium in each process. In terms of saving energy as well, applying a suitable amount of thermal energy to the thermoreversible recording medium is preferable.

Therefore, a laser device to irradiate the thermoreversible recording medium with a laser beam to heat up the thermoreversible recording medium changes the level of output of the laser beam, thereby maintaining the suitable amount of thermal energy applied to the thermoreversible recording medium in each operating mode. As a result, the heating state of the laser light source differs according to operating modes.

As described below, according to at least one embodiment of the present disclosure, a cooling operation of a cooling device is controlled depending on an operating state of an apparatus provided with the cooling device. This configuration saves energy for cooing, optimizing the temperature of a laser device.

A detailed description is provided of configurations according to embodiments of FIG. 1 through FIG. 10 of the present disclosure.

First Embodiment

Figure 4:
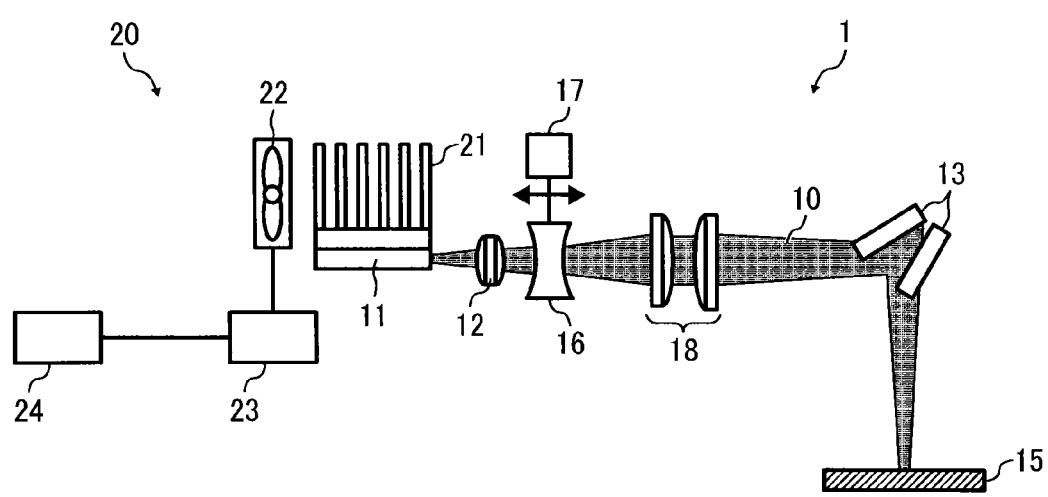
FIG. 4 is a schematic view of an example of the image processing apparatus including a cooling device.
Figure 5:
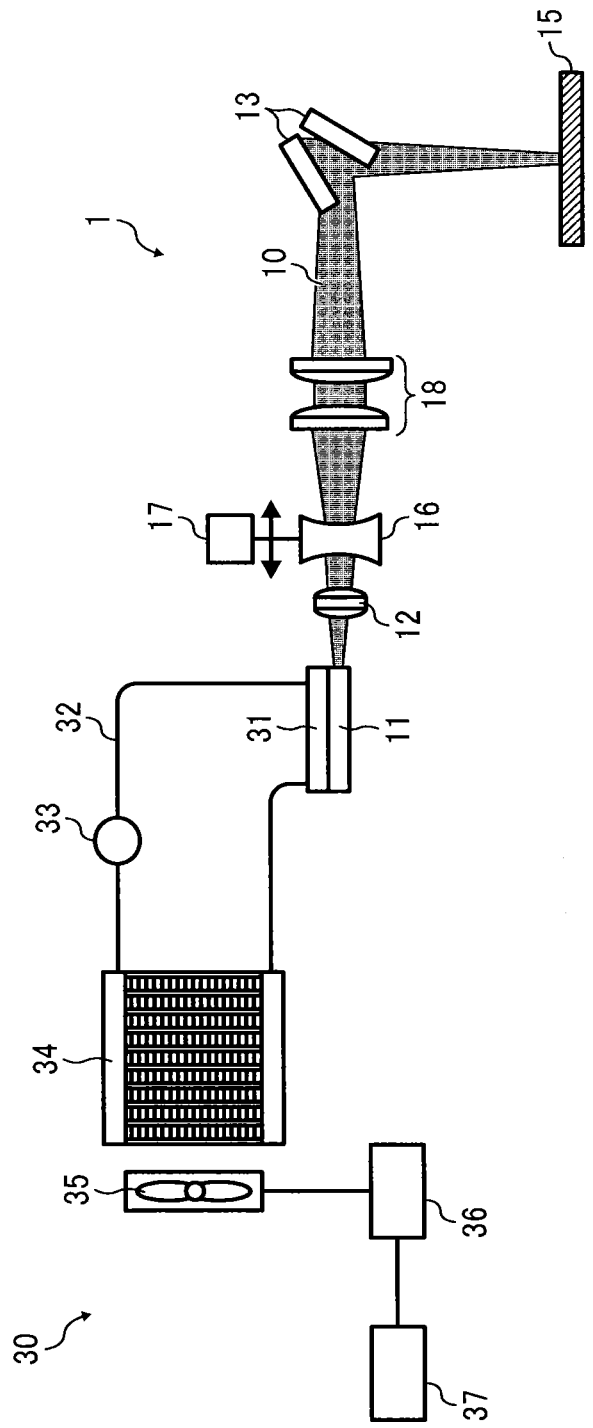
FIG. 5 is a schematic view of another example of the image processing apparatus including the cooling device.

As shown in FIG. 4 and FIG. 5, a cooling device (a cooling device 20 or a cooling device 30) according to the present embodiment includes a cooling controller (a second controller 23 or a second controller 36) to cool a laser light source (a laser light source 11). The laser light source (the laser light source 11) is disposed in a laser device (an image processing apparatus 1) as an image processing apparatus to irradiate a medium (a thermoreversible recording medium 15) with a laser beam (a laser beam 10). The cooling controller (the cooling controller 23 or the cooling controller 36) controls a cooling operation depending on a heating state of the laser light source (the laser light source 11) of the laser device (the image processing apparatus 1). In this case, data associated with the heating state of the laser light source (the laser light source 11) corresponds to the operating modes of the image processing apparatus.

(Thermoreversible Recording Medium)

FIG. 1 is an illustration of layers of a thermoreversible recording medium (a reversible thermal recording medium).

The thermoreversible recording medium 15 of FIG. 1 includes a substrate 101 and a thermoreversible recording layer 102. The thermoreversible recording medium 15 further includes an intermediate layer 103, an oxygen barrier layer 104, an ultraviolet absorbing layer 105, and other layers as appropriate. The intermediate layer 103, the oxygen barrier layer 104, the ultraviolet absorbing layer 105, and other layers are suitably selected according to the intended purpose.

[Substrate]

The shape, structure, size and the like of the substrate 101 can be selected according to the intended purpose and is not limited in any particular way. Examples of the shape of the substrate 101 include a planar shape. The substrate 101 may be of a single-layer structure or a multilayer structure. The size of the substrate 101 can be appropriately selected according to the size of the thermoreversible recording medium 15.

[Thermoreversible Recording Layer]

The thermoreversible recording layer 102 includes a leuco dye and a reversible developer. The leuco dye is an electron donative coloring compound that causes a reversible change of color tone upon heating. The reversible developer is an electron acceptive compound. That is, the thermoreversible recording layer 102 reversibly changes a color tone upon heating. The thermoreversible recording layer 102 includes other components as needed, in addition to a binder resin.

The leuco dye and the reversible developer are materials capable of exhibiting a phenomenon in which visible changes are reversibly produced by temperature change; and the material can relatively change into a colored state and into a decolored state, depending upon the heating temperature and the cooling rate after heating.

[Leuco Dye]

A leuco dye is a dye precursor which is colorless or pale per se. Examples thereof include, but are not limited to, leuco compounds based upon triphenylmethane phthalide, triarylmethane, fluoran, phenothiazine, thiofluoran compounds, xanthene, rhodamine anilino lactam, rhodamine lactam, quinazoline, diaza xanthene, bislactone. Among these compounds, fluoran leuco compounds and phthalide leuco compounds are particularly preferable because these compounds are advantageous in terms of the coloring and decoloring characteristics, hue, and stability.

[Reversible Developer]

A reversible developer (hereinafter, referred to as a developer in some cases) is not limited to a particular compound, and can be selected according to the intended purposes as long as it reversibly develops and erases a color according to a heat. Suitable examples thereof include a compound having in its molecule one or more structures selected from the following structures: a structure (1) having such color-developing ability as allows the leuco dye to form color (for example, a phenolic hydroxyl group, a carboxylic acid group, or a phosphoric acid group); and a structure (2) which regulates intermolecular aggregation, exemplified by a structure to which a long-chain hydrocarbon group is linked. Additionally, a divalent or higher linking group, including a heteroatom, may be present at the linking portion; also, at least one of a similar lining group and an aromatic group may be contained in the long-chain hydrocarbon group.

(Image Recording and Image Erasing Mechanism)

Next, a description is provided of an image recording and image erasing mechanism. The image recording and image erasing mechanism includes an aspect in which color tone reversibly changes according to heat. The aspect is such that a leuco dye and a reversible developer are contained in the thermoreversible recording layer to reversibly change the color tone according to heat between a transparent state and a colored state.

Figure 2:
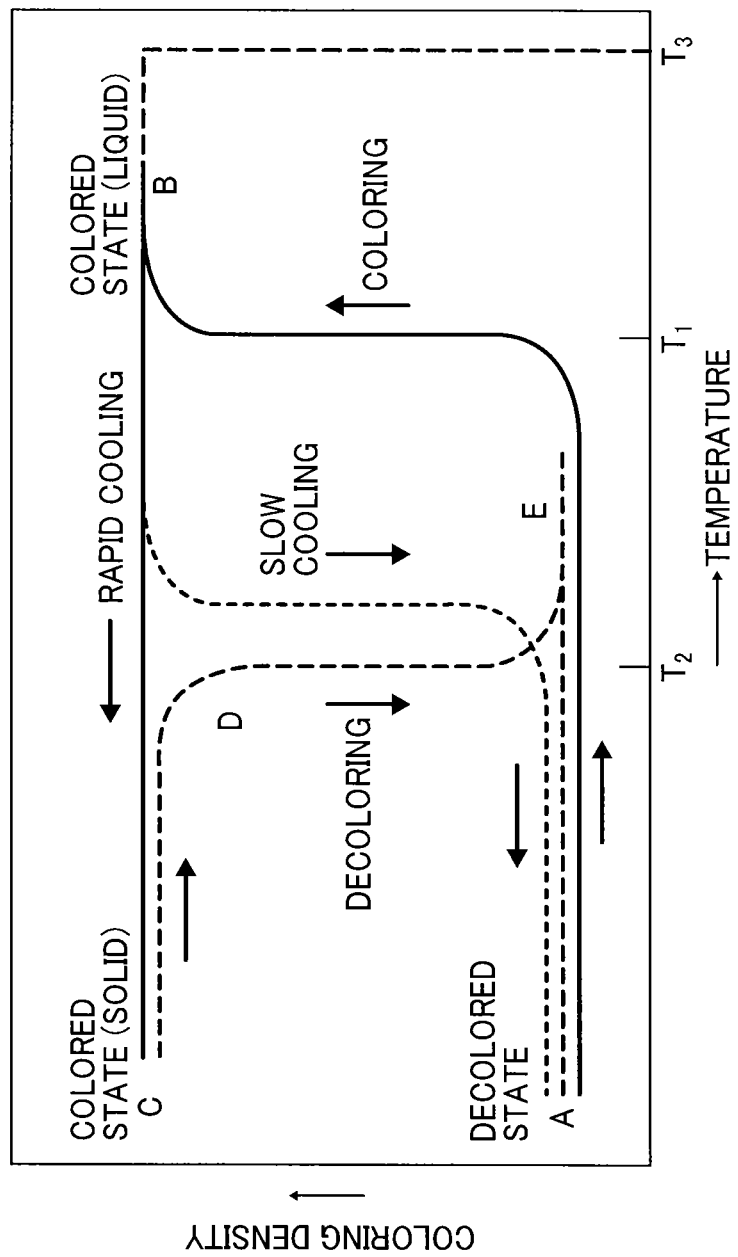
FIG. 2 is an illustration of an example of a temperature-coloring density change curve of the thermoreversible recording medium.

FIG. 2 is an illustration of an example of a temperature-coloring density change curve of a thermoreversible recording medium having a thermoreversible recording layer containing the leuco dye and the developer.

Initially, when the thermoreversible recording layer in a decolored (colorless) state (A) is heated up, the leuco dye and the developer melt and mix at the melting temperature $T_1$, thereby developing color, and the thermoreversible recording layer thusly comes into a melted and colored state (B) at the temperature $T_3$. When the thermoreversible recording layer in the melted and colored state (B) is rapidly cooled, the thermoreversible recording layer can be cooled to room temperature, with its colored state kept, and it, therefore, comes into a colored state (C) where its colored state is stabilized and fixed.

Whether or not this colored state is obtained depends upon the temperature decreasing rate from the temperature in the melted state: in the case of slow cooling, the color is erased in the temperature decreasing process, and the thermoreversible recording layer returns to the decolored state (A) which is the same as at the beginning, or comes into a state in which the density is lower than the density in the colored state (C) produced by rapid cooling. When the thermoreversible recording layer in the colored state (C) is heated up again, the color is erased at the temperature $T_2$ lower than the coloring temperature (from D to E), and when the thermoreversible recording layer in this state is cooled, it returns to the decolored state (A) which is the same as at the beginning.

The colored state (C) obtained by rapidly cooling the thermoreversible recording layer in the melted state is a state in which the leuco dye and the developer are mixed together such that their molecules can undergo contact reaction, which is often a solid state. This state is a state, in which a melted mixture (coloring mixture) of the leuco dye and the developer crystallizes, and thus color is maintained, and it is inferred that the color is stabilized by the formation of this structure.

Meanwhile, the decolored state (A) is a state in which the leuco dye and the developer are phase-separated. It is inferred that this state is a state in which molecules of at least one of the compounds gather to constitute a domain or crystallize, and thus a stabilized state in which the leuco dye and the developer are separated from each other by the occurrence of the flocculation or the crystallization. In many cases, phase separation of the leuco dye and the developer is brought about, and the developer crystallizes in this manner, thereby enabling color erasure with greater completeness.

(Structure of Image Processing Apparatus)

Next, a description is provided of a structure of an image processing apparatus according to the first embodiment of the present disclosure.

The image processing apparatus according to the first embodiment of the present disclosure includes a laser beam emitting device, a laser beam scanning device, and a focal length adjustment device, and a data setting device. The laser beam emitting device emits a laser beam. The laser beam scanning device causes a laser beam to scan an irradiation surface on a thermoreversible recording medium. The focal length adjustment device includes a movable lens system, disposed between the laser beam emitting device and the laser beam scanning device. The focal length adjustment device adjusts a position of the lens system to adjust a focal length of the laser beam. The data setting device inputs and sets data, such as image erasing data, image recording data, and data regarding distance between a thermoreversible recording medium and a laser beam emitting surface of the laser beam emitting device.

In the case of erasing an image, the focal length adjustment device defocuses the laser beam at a position of the thermoreversible recording medium. In the case of recording an image, the focal length adjustment device focuses the laser beam on the thermoreversible recording medium such that the focal length extends to the position of the thermoreversible recording medium. Immediately after erasing an image, which has been performed according to the image erasing data set by the data setting device, another image is recorded according to the image recording data.

Figure 3:
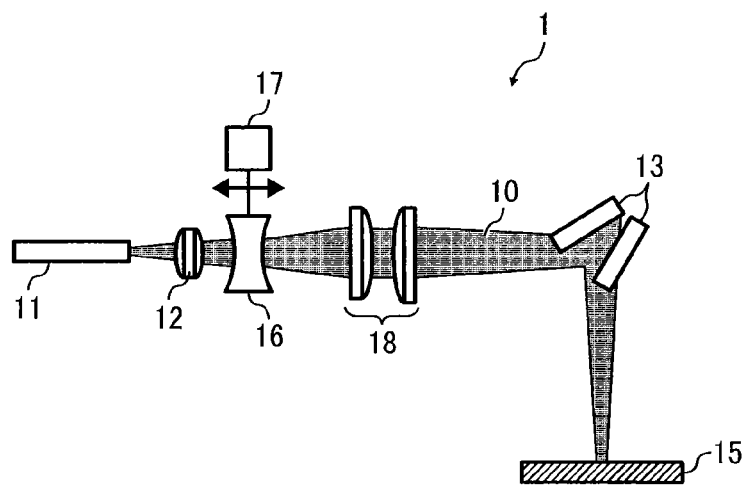
FIG. 3 is a schematic view of a configuration of an image processing apparatus according to a first embodiment of the present disclosure.

FIG. 3 is a schematic view of an example of the image processing apparatus according to the first embodiment of the present disclosure.

The image processing apparatus 1 includes a laser light source 11 as the laser beam emitting device, a collimator lens 12, a galvano mirror 13 as the laser beam scanning device, a diffusing lens 16, a lens position adjustment device 17, and condenser lenses 18. The collimator lens 12 collimates a laser beam 10 emitted from the laser light source 11, and the collimated beam travels through the diffusing lens 16 to be collected by the condenser lenses 18. Such a lens system changes the focal position thereof with a position of the diffusing lens along an irradiation direction of the laser beam.

The diffusing lens 16 provided with the lens position adjustment device 17 is movable along the irradiation direction of the laser beam. The focal length adjustment device includes the diffusing lens 16 and the lens position adjustment device 17. The lens position adjustment device 17 is movable at high speed under control of a pulse motor, thus allowing adjustment of the focal length at high speed. The galvano mirror 13 as the laser beam scanning device cause the laser beam 10 to scan the thermoreversible recording medium 15.

[Laser Beam Emitting Device]

A laser beam emitting device emits a laser beam. Examples thereof include a yttrium aluminum garnet (YAG) laser, a fiber laser, a semiconductor laser (LD), and a fiber coupled laser, but not limited thereto. Among these lasers, the fiber coupled laser is particularly preferable in that a spectral profile in the form of a top hat can be obtained and an image with high visibility can be recorded.

[Laser Beam Scanning Device]

The galvano mirror 13 as the laser beam scanning device causes the laser beam 10 to scan the thermoreversible recording medium 15. Examples of the laser beam scanning device includes, but is not limited to, a galvanometer and mirrors mounted on the galvanometer, and are suitably selected according to the intended purpose.

[Focal Length Adjustment Device]

A focal length adjustment device includes a movable lens system disposed between a laser beam emitting device and a laser beam scanning device. The focal length adjustment device adjusts a position of the lens system to adjust the focal length of a laser beam.

In the case of the image erasing, the focal length adjustment device causes the laser beam to defocus on a thermoreversible recording medium. In the case of the image recording, the focal length adjustment device focuses the laser beam onto a thermoreversible recording medium.

[Image Setting Device Disposed in the Image Processing Apparatus]

A data setting device inputs and sets an image erasing data, an image recording data, and data regarding the distance (hereinafter, in some cases, referred to as distance data) between the thermoreversible recording medium and the laser beam emitting surface of the laser beam emitting device.

In the image recording process and the image erasing process, the focal length adjustment device adjusts the focal length according to the set value of the data regarding the distance between the thermoreversible recording medium and the laser beam emitting surface of the laser beam emitting device.

The data setting device forms a control file containing the image erasing data, the image recording data, and the distance data, transferring the control file to a first controller as a laser emitting controller to control a galvano mirror and a laser emitting device.

(Operating Modes of Image Processing Apparatus)

The image setting device selects one of three operating modes: an image recording mode (a first operating mode), an image erasing mode (a second operating mode), and a rewriting mode (a third operating mode) in which both the image erasing and the image recording are performed. A description is provided of the three operating modes.

[Image Recording Mode]

In an image recording mode (a first operating mode), a focal length adjustment device causes a laser beam emitted from a laser beam emitting device to focus onto a thermoreversible recording medium, thereby allowing the laser beam collected to scan the thermoreversible recording medium. Accordingly, the leuco dye and developer contained in the thermoreversible recording medium are heated up to a melting temperature $T_1$, and then is rapidly cooled. As a result, the thermoreversible recording medium comes into a colored state, i.e., a solid state, allowing an image to be recorded thereon.

[Image Erasing Mode]

In the image erasing mode (a second operating mode), a focal length adjustment device causes a laser beam emitted from a laser beam emitting device to defocus on a thermoreversible recording medium. Accordingly, the laser beam having an increased spot diameter scans the thermoreversible recording medium, thereby raising a leuco dye and developer contained therein in temperature up to a temperature $T_2$ lower than the melting temperature. Thus, the thermoreversible recording medium comes into a decolored (colorless) state, allowing an image to be erased.

[Rewriting Mode]

In a rewriting mode (a third operating mode), an image recorded on a thermoreversible recording medium is first erased, and a new image is then recorded on the thermoreversible recording medium.

(Structure of Cooling Device)

A description of the structure of the image processing apparatus 1 is omitted because it is the same as that of FIG. 3.

FIG. 4 is a schematic view of an example of an image processing apparatus including a cooling device.

In particular, FIG. 4 is a view of an example of an air-cooled cooling device 20. The cooling device 20 includes a heat sink 21 contacting a laser light source 11, a fan 22, and a second controller 23 as a cooling controller to control the fan 22. The second controller 23 controls the rotation speed of the fan 22 (hereinafter, in some cases, referred to as the speed of the fan or the fan speed) according to data of a first controller 24 disposed in an image recording device, to change the amount of airflow, which works on the heat sink 21, thus controlling a cooling operation.

With such control, the cooling performance of the cooling device 20 varies depending on the operating state of the image processing apparatus 1. This configuration saves energy for cooling while optimizing the temperature of a laser light source.

FIG. 5 is a schematic view of another example of the image processing apparatus including the cooling device.

In particular, FIG. 5 is a view of an example of an air-cooled cooling device 30. The cooling device 30 includes a heat receiving part 31 contacting the laser light source 11, a pump 33, a heat dissipating part 34, a tube, a fan 35, and a second controller 36 as the cooling controller to control the fan 35. The heat receiving part 31 includes a coolant channel therewithin. The pump 33 delivers the coolant to the heat receiving part 31 through the channel. The heat dissipating part 34 exchanges heat between the coolant and air. The tube 32 connects the heat receiving part 31, the pump 33, and the heat dissipating part 34. The fan 35 provides airflow to the heat dissipating part 34.

The heat receiving part 31 receives heat from the laser light source 11, heating the coolant therein. The heated coolant is then cooled in the heat dissipating part 34 by airflow generated by the fan 35. In this case, the pump 33 and the tube 32 circulates a predetermined amount of coolant to cool the heated coolant.

The second controller 36 of the fan 35 controls the speed of the fan 35 according to data from a first controller 37 disposed in an image recording apparatus, to change the amount of airflow, which works on the heat dissipating part 34, thus controlling a cooling operation.

With such control, the cooling performance of the cooling device 30 varies depending on operating state of the image processing apparatus 1. This configuration saves energy for cooling while optimizing the temperature of a laser light source.

In addition to the control of the speed of the fan 35, the cooling performance of the cooling device 30 also varies with changes in the amount of coolant.

(Control of Cooling Device)

Figure 6:
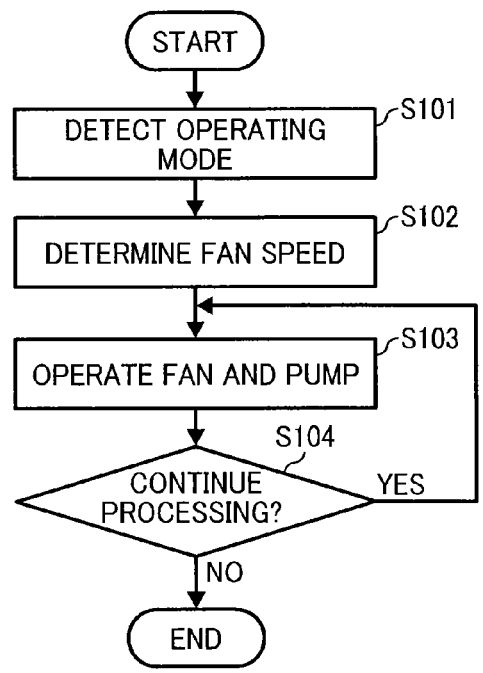
FIG. 6 is a flowchart of a cooling control process performed by the cooling device according to the first embodiment of the present disclosure.

FIG. 6 is a flowchart of a cooling control process performed by a second controller of a cooling device according to the first embodiment of the present disclosure. In the present embodiment, the cooling device is controlled according to the operating modes. A description is provided of the control of a cooling device 30 of FIG. 5 as an example. It should be noted that the same description as that of FIG. 5 applies to a cooling device 20 of FIG. 4 except for the control of a pump, which is not included in the cooling device 20.

The cooling device starts operating at the start of processing of an image processing apparatus. The cooling device first detects an operating mode of the image processing apparatus in a step for detecting an operating mode (S101) (hereinafter, referred to simply as step S101).

Subsequently, in a step for determining the speed of a fan (S102) (hereinafter, referred to as step S102), the cooling device determines the speed of the fan in response to the detection result of step S101.

Next, the cooling device starts operating the fan and pump in a step for operating the fan and pump (S103) (hereinafter, referred to as step S103). In this case, the speed of the fan, which has been determined in step S102, is applied as the fan speed.

Next, in a step for judging whether to continue processing (S104), the cooling device judges whether to continue the processing of the image processing apparatus. When an affirmative judgment is made (Yes) in step S104, the process goes to a step for operating the fan and pump (S103). When a negative judgment is made (No) in step S104, the process goes to "END" to stop operating the fan and pump.

Table 1 shows the correspondence between the operating modes and fan speeds in step S102.

TABLE 1

| OPERATING MODES | FAN SPEED |
|---|---|
| IMAGE ERASING | 100% |
| REWRITING | 80% |
| IMAGE RECORDING | 60% |

In the present embodiment, the amount of heat in the laser light source increases in the order of the image recording mode, the rewriting mode, and the image erasing mode. That is, when the amount of heat in the laser light source in the image recording mode is E1, that of the rewriting mode is E2, and that of the image erasing mode is E3; E1, E2, and E3 satisfy relations of E3>E2>E1.

As shown in Table 1, the fan speed in the image erasing mode corresponds to a rotation speed of 100% of the rated rotation speed. The fan speed in the rewriting mode corresponds to a rotation speed of 80% of the rated rotation speed. The fan speed in the image recording mode corresponds to a rotation speed of 60% of the rated rotation speed.

It should be noted that, the set values of the above-described fan speed are obtained by preliminary experiments and simulation studies such that the laser light source has a temperature below the permissible upper limit temperature.

According to the present embodiment, the cooling device to cool a laser light source controls a cooling operation according to the operation states (the operating modes) of an apparatus, such as a laser light emitting apparatus and an image processing apparatus, provided with the laser light source. The cooling device also changes a cooling performance depending on a heating state of the laser light source. With such a configuration, the laser light source maintains a permissible temperature without consuming an excessive amount of cooling energy. Thus, the laser light source maintains an optimized temperature while energy for cooling is saved.

In addition, as the cooling device changes the cooling performance according to the operating modes, the cooling performance of the cooling device can be determined according to the operating modes with no sensors employed, thus allowing a simple configuration.

Second Embodiment

A description is provided of a cooling device according to a second embodiment of the present disclosure. A description is omitted of aspects that are the same as those of the above-described embodiment.

The cooling device according to the second embodiment controls a cooling operation according to productivity in addition to operating modes of an image processing apparatus.

(Productivity)

The term "productivity" used herein refers to the number of thermoreversible recording media processed by an image processing apparatus per fixed time period. The image processing apparatus changes a time interval between laser-beam irradiation events to vary the productivity. In this case, the time interval between the laser-beam irradiation events is reduced to increase the productivity while the time interval is increased to decrease the productivity.

When increasing the productivity, the total time periods of the laser-beam irradiation increases, so that the amount of heat in a laser light source increases. When decreasing the productivity, the total time periods of the laser-beam irradiation reduces, so that the amount of heat in the laser light source reduces.

(Cooling Controller)

Figure 7:
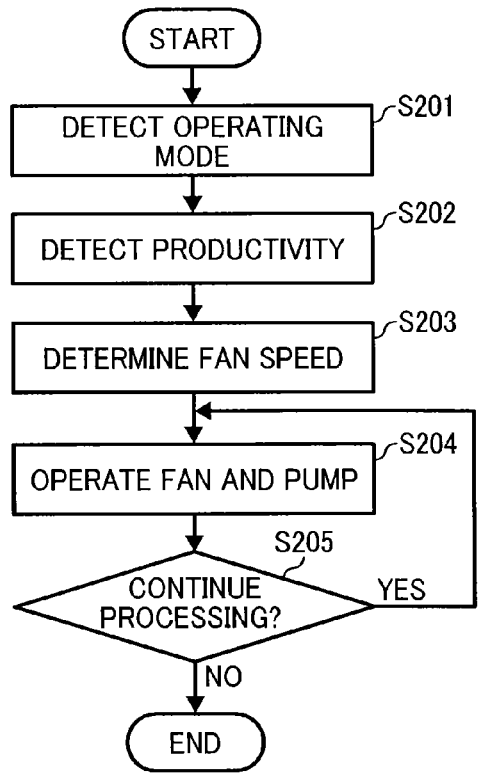
FIG. 7 is a flowchart of a cooling control process performed by a cooling device according to a second embodiment of the present disclosure.

FIG. 7 is a flowchart of a cooling control process performed by a second controller in a cooling device according to a second embodiment of the present disclosure. In the present embodiment, the cooling device is controlled according to the operating modes and productivity in an image processing apparatus.

The cooling device starts operating at the start of processing of an image processing apparatus. The cooling device first detects an operating mode of the image processing apparatus in a step for detecting an operating mode (S201) (hereinafter, referred to simply as step S201).

Then, the cooling device detects the productivity in the image processing apparatus in a step for detecting a productivity (S202) (hereinafter, referred to simply as step S202).

Subsequently, in a step for determining fan speed (S203) (hereinafter, referred to as step S203), the cooling device determines the speed of the fan according to the results of step 201 and step 202.

Following step 203, the cooling device starts operating the fan and pump in a step for operating fan and pump (S204) (hereinafter, referred to as step S204). In this case, the fan speed, which has been determined in step S203, is applied.

Next, in a step for judging whether to continue processing (S205), the cooling device judges whether to continue the processing of the image processing apparatus. When an affirmative judgment is made (Yes) in step S205, the process goes to a step for operating fan and pump (S204). When a negative judgment is made (No) in step S205, the process goes to "END" to stop operating the fan and pump.

Table 2 shows the correspondence between operating modes, productivity, and fan speeds in step S203.

TABLE 2

| OPERATING MODES | PRODUCTIVITY | FAN SPEED |
|---|---|---|
| IMAGE ERASING | 0% < PRODUCTIVITY ≤ 30% | 60% |
|  | 30% < PRODUCTIVITY ≤ 70% | 80% |
|  | 70% < PRODUCTIVITY ≤ 100% | 100% |
| REWRITING | 0% < PRODUCTIVITY ≤ 30% | 50% |
|  | 30% < PRODUCTIVITY ≤ 70% | 70% |
|  | 70% < PRODUCTIVITY ≤ 100% | 90% |
| IMAGE RECORDING | 0% < PRODUCTIVITY ≤ 30% | 40% |
|  | 30% < PRODUCTIVITY ≤ 70% | 60% |
|  | 70% < PRODUCTIVITY ≤ 100% | 80% |

In the present embodiment, the amount of heat in a laser light source increases in the order of the image recording mode, the rewriting mode, and the image erasing mode. That is, when the amount of heat in the laser light source in the image recording mode is E1, that of the rewriting mode is E2, and that of the image erasing mode is E3; E1, E2, and E3 satisfy relations of E3>E2>E1. In each of the operating modes, as the productivity increases, the amount of heat in the laser light source increases.

As shown in Table 2, in the image erasing mode, when the productivity is greater than 0% (no production is made) and less than or equal to 30%, the fan speed corresponds to a rotation speed of 60% of the rated rotation speed. When the productivity is greater than 30% and less than or equal to 70%, the fan speed corresponds to a rotation speed of 80% of the rated rotation speed. When the productivity is greater than 70% and less than or equal to 100%, the fan speed corresponds to a rotation speed of 100%.

In the rewriting mode, when the productivity is greater than 0% and less than or equal to 30%, the fan speed corresponds to a rotation speed of 50% of the rated rotation speed. When the productivity is greater than 30% and less than or equal to 70%, the fan speed corresponds to a rotation speed of 70% of the rated rotation speed. When the productivity is greater than 70% and less than or equal to 100%, the fan speed corresponds to a rotation speed of 90%.

In the image recording mode, when the productivity is greater than 0% and less than or equal to 30%, the fan speed corresponds to a rotation speed of 40% of the rated rotation speed. When the productivity is greater than 30% and less than or equal to 70%, the fan speed corresponds to a rotation speed of 60% of the rated rotation speed. When the productivity is greater than 70% and less than or equal to 100%, the fan speed corresponds to a rotation speed of 80%.

The cooling device according to the second embodiment changes a cooling performance according to the operating modes and productivity of the image processing apparatus. With such a configuration, the laser light source maintains a permissible temperature without consuming an excessive amount of cooling energy.

Third Embodiment

A cooling device according to the third embodiment controls a cooling operation according to an ambient temperature of an image processing apparatus, in addition to the operating modes and productivity of the image processing apparatus.

(Ambient Temperature)

There is a need to increase the temperature of a thermoreversible recording medium to a predetermined temperature in both cases of coloring (recording an image) and decoloring (erasing an image). Accordingly, each of the thermal energies for developing a color (recording an image) and erasing a color (erasing an image) varies with the temperature of the thermoreversible recording medium. In the present embodiment, as the temperature of the thermoreversible recording medium increases, each of the thermal energies for developing a color (recording an image) and erasing a color (erasing an image) reduces. As the temperature of the thermoreversible recording medium decreases, each thermal energy increases.

The same as described above applies to the output of a laser light source. As the temperature of the thermoreversible recording medium increases, the amount of heat in the laser light source reduces. As the temperature of the thermoreversible recording medium decreases, the amount of heat in the laser light source increases. Further, in many cases, the thermoreversible recording medium is at the same temperature as the ambient temperature of the image processing apparatus because the thermoreversible recording medium itself does not produce heat. Accordingly, as the ambient temperature increases, the amount of heat in the laser light source reduces. As the ambient temperature decreases, the amount of heat in the laser light source increases.

(Control of Cooling Device)

Figure 8:
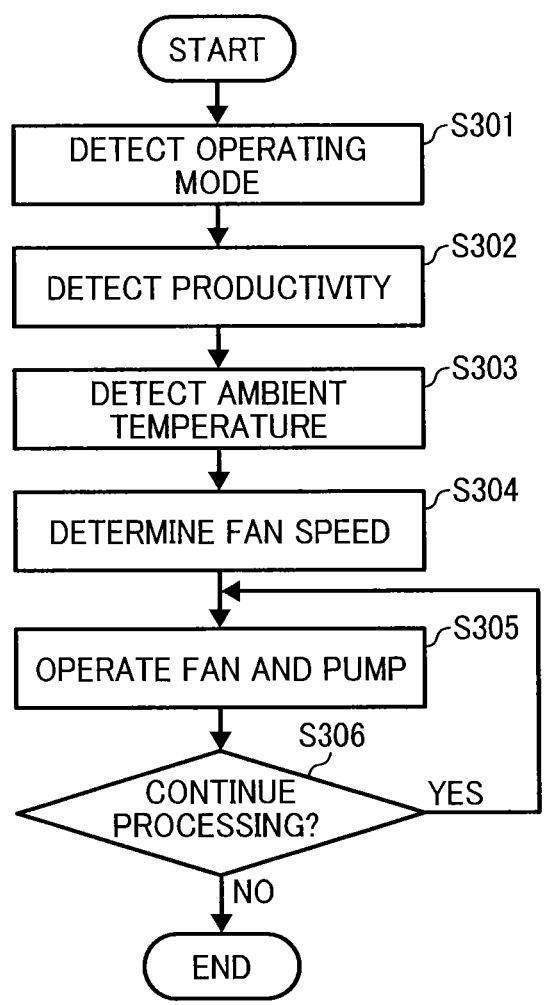
FIG. 8 is a flowchart of a cooling control process performed by a cooling device according to a third embodiment of the present disclosure.

FIG. 8 is a flowchart of a cooling control process performed by a second controller in a cooling device according to a third embodiment of the present disclosure. In this case, the second controller is a controller as a cooling controller, disposed in the cooling device. In the present embodiment, the cooling device is controlled according to the operating modes, productivity, and ambient temperature of an image processing apparatus.

To measure the ambient temperature of the image processing apparatus, the second controller 36 of the cooling device 30 in FIG. 5 captures a detection value of an ambient-temperature detector disposed outside the image processing apparatus 1. Alternatively, in some embodiments, the ambient-temperature detector is disposed in the image processing apparatus 1, and the second controller 36 may receive a value of the ambient-temperature detector from the image processing apparatus 1.

The cooling device starts operating at the start of processing of an image processing apparatus. The cooling device first detects an operating mode of the image processing apparatus in a step for detecting an operating mode (S301) (hereinafter, referred to simply as step S301).

Then, the cooling device detects the productivity in the image processing apparatus in a step for detecting productivity (S302) (hereinafter, referred to simply as step S302).

Then, the cooling device detects the ambient temperature of the image processing apparatus in a step for detecting ambient temperature (S303) (hereinafter, referred to simply as step S303).

Subsequently, in a step for determining fan speed (S304) (hereinafter, referred to as step S304), the cooling device determines the speed of the fan according to the results of step 301, step 302, and step 303.

Following step 304, the cooling device starts operating the fan and pump in a step for operating fan and pump (S305) (hereinafter, referred to as step S305). In this case, the fan speed, which has been determined in step S304, is applied.

Next, in a step for judging whether to continue processing (S306), the cooling device judges whether to continue the processing of the image processing apparatus. When an affirmative judgment is made (Yes) in step S306, the process goes to a step for operating fan and pump (S305). When a negative judgment is made (No) in step S306, the process goes to "END" to stop operating the fan and pump.

Table 2 shows the correspondence between operating modes, productivity, and fan speeds in step S304.

TABLE 3

| OPERATING MODES | PRODUCTIVITY | AMBIENT TEMPERATURE | FAN SPEED |
|---|---|---|---|
| IMAGE ERASING | 0% < PRODUCTIVITY ≤ 30% | LOWER LIMIT ≤ AMBIENT TEMPERATURE ≤ {LOWER | 40% |

TABLE 3-continued

| OPERATING MODES | PRODUCTIVITY | AMBIENT TEMPERATURE | FAN SPEED |
|---|---|---|---|
| | | LIMIT + (UPPER LIMIT-LOWER LIMIT)/3} | |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 50% |
| | | {LOWER LIMIT + (UPPER LIMIT-LOWER LIMIT) × 2/3} < AMBIENT TEMPERATURE ≤ UPPER LIMIT | 60% |
| | 30% < PRODUCTIVITY ≤ 70% | LOWER LIMIT ≤ AMBIENT TEMPERATURE ≤ {LOWER LIMIT + (UPPER LIMIT-LOWER LIMIT)/3} | 60% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 70% |
| | | {LOWER LIMIT + (UPPER LIMIT-LOWER LIMIT) × 2/3} < AMBIENT TEMPERATURE ≤ UPPER LIMIT | 80% |
| | 70% < PRODUCTIVITY ≤ 100% | LOWER LIMIT ≤ AMBIENT TEMPERATURE ≤ {LOWER LIMIT + (UPPER LIMIT-LOWER LIMIT)/3} | 80% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 90% |
| | | {LOWER LIMIT + (UPPER LIMIT-LOWER LIMIT) × 2/3} < AMBIENT TEMPERATURE ≤ UPPER LIMIT | 100% |
| REWRITING | 0% < PRODUCTIVITY ≤ 30% | LOWER LIMIT ≤ AMBIENT TEMPERATURE ≤ {LOWER LIMIT + (UPPER LIMIT-LOWER LIMIT)/3} | 30% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 40% |
| | | {LOWER LIMIT + (UPPER LIMIT-LOWER LIMIT) × 2/3} < AMBIENT TEMPERATURE ≤ UPPER LIMIT | 50% |
| | 30% < PRODUCTIVITY ≤ 70% | LOWER LIMIT ≤ AMBIENT TEMPERATURE ≤ {LOWER LIMIT + (UPPER LIMIT-LOWER LIMIT)/3} | 50% |
| | | {LOWER LIMIT + (UPPER LIMIT-LOWER LIMIT)/3} < AMBIENT TEMPERATURE ≤ { LOWER LIMIT + (UPPER LIMIT-LOWER LIMIT) × 2/3} | 60% |
| | | {LOWER LIMIT + (UPPER LIMIT-LOWER LIMIT) × 2/3} < AMBIENT TEMPERATURE ≤ UPPER LIMIT | 70% |
| | 70% < PRODUCTIVITY ≤ 100% | LOWER LIMIT ≤ AMBIENT TEMPERATURE ≤ {LOWER LIMIT + (UPPER LIMIT-LOWER LIMIT)/3} | 70% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 80% |
| | | {LOWER LIMIT + (UPPER LIMIT-LOWER LIMIT) × 2/3} < AMBIENT TEMPERATURE ≤ UPPER LIMIT | 90% |
| IMAGE RECORDING | 0% < PRODUCTIVITY ≤ 30% | LOWER LIMIT ≤ AMBIENT TEMPERATURE ≤ {LOWER LIMIT + (UPPER LIMIT-LOWER LIMIT)/3} | 20% |
| | | {LOWER LIMIT + (UPPER LIMIT-LOWER LIMIT)/3} < AMBIENT TEMPERATURE ≤ {LOWER | 30% |

TABLE 3-continued

| OPERATING MODES | PRODUCTIVITY | AMBIENT TEMPERATURE | FAN SPEED |
|---|---|---|---|
| | | LIMIT + (UPPER LIMIT-LOWER LIMIT) × 2/3} | |
| | | {LOWER LIMIT + (UPPER LIMIT-LOWER LIMIT) × 2/3} < AMBIENT TEMPERATURE ≤ UPPER LIMIT | 40% |
| | 30% < PRODUCTIVITY ≤ 70% | LOWER LIMIT ≤ AMBIENT TEMPERATURE ≤ {LOWER LIMIT + (UPPER LIMIT-LOWER LIMIT)/3} | 40% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 50% |
| | | {LOWER LIMIT + (UPPER LIMIT-LOWER LIMIT) × 2/3} < AMBIENT TEMPERATURE ≤ UPPER LIMIT | 60% |
| | 70% < PRODUCTIVITY ≤ 100% | LOWER LIMIT ≤ AMBIENT TEMPERATURE ≤ {LOWER LIMIT + (UPPER LIMIT-LOWER LIMIT)/3} | 60% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 70% |
| | | {LOWER LIMIT + (UPPER LIMIT-LOWER LIMIT) × 2/3} < AMBIENT TEMPERATURE ≤ UPPER LIMIT | 80% |

In the present embodiment, the amount of heat in a laser light source increases in the order of the image recording mode, the rewriting mode, and the image erasing mode. That is, when the amount of heat in the laser light source in the image recording mode is E1, that of the rewriting mode is E2, and that of the image erasing mode is E3; E1, E2, and E3 satisfy relations of E3>E2>E1. In each of the operating modes, as the productivity increases, the amount of heat in the laser light source increases. Further, as the ambient temperature decreases, the amount of heat in the laser light source increases. A description is provided of the three operating modes.

[Image Erasing Mode]

In the case that the productivity is greater than 0% and less than or equal to 30%, when the relation of Lower Limit≤Ambient Temperature≤{Lower Limit+(Upper Limit-Lower Limit)/3} is satisfied, the fan speed corresponds to a rotation speed of 60% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 50% of the rated rotation speed. When the relation of {Lower Limit+(Upper Limit-Lower Limit)×2/3}<Ambient Temperature≤Upper Limit is satisfied, the fan speed corresponds to a rotation speed of 40% of the rated rotation speed.

In the case that the productivity is greater than 30% and less than or equal to 70%, when the relation of Lower Limit≤Ambient Temperature≤{Lower Limit+(Upper Limit-Lower Limit)/3} is satisfied, the fan speed corresponds to a rotation speed of 80% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 70% of the rated rotation speed. When the relation of {Lower Limit+(Upper Limit-Lower Limit)×2/3}<Ambient Temperature≤Upper Limit is satisfied, the fan speed corresponds to a rotation speed of 60% of the rated rotation speed.

In the case that the productivity is greater than 70% and less than or equal to 100%, when the relation of Lower Limit≤Ambient Temperature≤{Lower Limit+(Upper Limit-Lower Limit)/3} is satisfied, the fan speed corresponds to a rotation speed of 100% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 90% of the rated rotation speed. When the relation of {Lower Limit+(Upper Limit-Lower Limit)×2/3}<Ambient Temperature≤Upper Limit is satisfied, the fan speed corresponds to a rotation speed of 80% of the rated rotation speed.

[Rewriting Mode]

In the case that the productivity is greater than 0% and less than or equal to 30%, when the relation of Lower Limit≤Ambient Temperature≤{Lower Limit+(Upper Limit-Lower Limit)/3} is satisfied, the fan speed corresponds to a rotation speed of 50% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 40% of the rated rotation speed. When the relation of {Lower Limit+(Upper Limit-Lower Limit)×2/3}<Ambient Temperature≤Upper Limit is satisfied, the fan speed corresponds to a rotation speed of 30% of the rated rotation speed.

In the case that the productivity is greater than 30% and less than or equal to 70%, when the relation of Lower Limit≤Ambient Temperature≤{Lower Limit+(Upper Limit-Lower Limit)/3} is satisfied, the fan speed corresponds to a rotation speed of 70% of the rated rotation speed. When the relation of {Lower Limit+(Upper Limit-Lower Limit)/3}<Ambient Temperature≤{Lower Limit+(Upper Limit- Lower Limit)×2/3} is satisfied, the fan speed corresponds to a rotation speed of 60% of the rated rotation speed. When the relation of {Lower Limit+(Upper Limit-Lower Limit)×2/3}<Ambient Temperature≤Upper Limit is satisfied, the fan speed corresponds to a rotation speed of 50% of the rated rotation speed.

In the case that the productivity is greater than 70% and less than or equal to 100%, when the relation of Lower Limit≤Ambient Temperature≤{Lower Limit+(Upper Limit-Lower Limit)/3} is satisfied, the fan speed corresponds to a rotation speed of 90% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 80% of the rated rotation speed. When the relation of {Lower Limit+(Upper Limit-Lower Limit)×2/3}<Ambient Temperature≤Upper Limit is satisfied, the fan speed corresponds to a rotation speed of 70% of the rated rotation speed.

[Image Recording Mode]

In the case that the productivity is greater than 0% and less than or equal to 30%, when the relation of Lower Limit≤Ambient Temperature≤{Lower Limit+(Upper Limit-Lower Limit)/3} is satisfied, the fan speed corresponds to a rotation speed of 40% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 30% of the rated rotation speed. When the relation of {Lower Limit+(Upper Limit-Lower Limit)×2/3}<Ambient Temperature≤Upper Limit is satisfied, the fan speed corresponds to a rotation speed of 20% of the rated rotation speed.

In the case that the productivity is greater than 30% and less than or equal to 70%, when the relation of Lower Limit≤Ambient Temperature≤{Lower Limit+(Upper Limit-Lower Limit)/3} is satisfied, the fan speed corresponds to a rotation speed of 60% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 50% of the rated rotation speed. When the relation of {Lower Limit+(Upper Limit-Lower Limit)×2/3}<Ambient Temperature≤Upper Limit is satisfied, the fan speed corresponds to a rotation speed of 40% of the rated rotation speed.

In the case that the productivity is greater than 70% and less than or equal to 100%, when the relation of Lower Limit≤Ambient Temperature≤{Lower Limit+(Upper Limit-Lower Limit)/3} is satisfied, the fan speed corresponds to a rotation speed of 80% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 70% of the rated rotation speed. When the relation of {Lower Limit+(Upper Limit-Lower Limit)×2/3}<Ambient Temperature≤Upper Limit is satisfied, the fan speed corresponds to a rotation speed of 60% of the rated rotation speed.

The cooling device according to the third embodiment changes a cooling performance according to the operating modes, productivity, and ambient temperature (the temperature of the thermoreversible recording medium) of the image processing apparatus. With such a configuration, the laser light source maintains a permissible temperature without consuming an excessive amount of cooling energy.

Alternatively, in some embodiments, the cooling device exhibits a cooling performance that varies with the operating modes and ambient temperature of the image processing apparatus.

Fourth Embodiment

A cooling device according to the fourth embodiment controls a cooling operation according to the temperature of a laser light source, in addition to the operating modes, productivity, and ambient temperature of the image processing apparatus.

[Temperature of Laser Beam Source]

A laser light source has the luminous efficiency that varies with the temperature of the laser light source. Typically, as the laser light source has an increased temperature, the luminous efficiency is reduced. As the laser light source has a reduced temperature, the luminous efficiency is increased. Accordingly, the amount of supplied power is corrected to obtain a desired output of the laser light source, according to the temperature of the laser light source. As the laser light source has an increased temperature, the amount of the supplied power is increased to compensate for the reduced luminous efficiency. As the laser light source has a reduced temperature, the amount of the supplied power is reduced to compensate for the increased the luminous efficiency. That is, as the laser light source has a high temperature, the amount of heat in the laser light source increases. As the laser light source has a low temperature, the amount of heat in the laser light source reduces.

(Control of Cooling Device)

Figure 9:
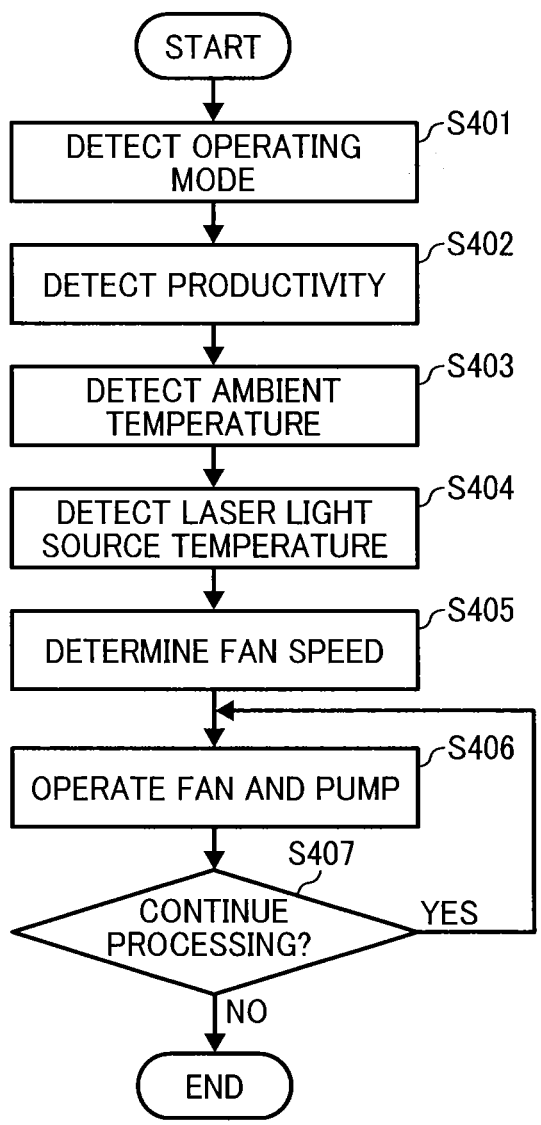
FIG. 9 is a flowchart of a cooling control process performed by a cooling device according to a fourth embodiment of the present disclosure.

FIG. 9 is a flowchart of a cooling control process performed by a second controller in a cooling device according to a fourth embodiment of the present disclosure. In the present embodiment, the cooling device is controlled according to the operating modes, productivity, ambient temperature, and laser light source temperature of an image processing apparatus.

To measure the temperature of the laser light source, the second controller 36 of the cooling device 30 in FIG. 5 captures a detection value of a laser light source temperature detector disposed in the laser light source 11. Alternatively, in some embodiments, the laser light source is disposed in the image processing apparatus 1, and the second controller 36 may receive a value of the laser light source temperature detector from the image processing apparatus 1.

The cooling device starts operating at the start of processing of an image processing apparatus. The cooling device first detects an operating mode of the image processing apparatus in a step for detecting an operating mode (S401) (hereinafter, referred to simply as step S401).

Then, the cooling device detects the productivity in the image processing apparatus in a step for detecting productivity (S402) (hereinafter, referred to simply as step S402).

Then, the cooling device detects the ambient temperature of the image processing apparatus in a step for detecting ambient temperature (S403) (hereinafter, referred to simply as step S403).

Then, the cooling device detects the temperature of the laser light source in a step for detecting laser light source temperature (S404) (hereinafter, referred to simply as step S404).

Subsequently, in a step for determining fan speed (S405) (hereinafter, referred to as step S405), the cooling device determines the speed of the fan according to the results of step 402, step 403, and step 404.

Following step 405, the cooling device starts operating the fan and pump in a step for operating fan and pump (S406) (hereinafter, referred to as step S406). In this case, the fan applies the speed, which has been determined in step S405.

Next, in a step for judging whether to continue processing (S407), the cooling device judges whether to continue the processing of the image processing apparatus. When an affirmative judgment is made (Yes) in step S407, the process goes to a step for operating fan and pump (S406). When a negative judgment is made (No) in step S407 the process goes to "END" to stop operating the fan and pump.

Each of Tables 4 and 5 shows the correspondence between operating modes, productivity, and fan speeds in step S405.

TABLE 4

| OPERATING MODES | PRODUCTIVITY | AMBIENT TEMPERATURE | FAN SPEED |
|---|---|---|---|
| IMAGE ERASING | 0% < PRODUCTIVITY ≤ 30% | LOWER LIMIT ≤ AMBIENT TEMPERATURE ≤ {LOWER LIMIT + (UPPER LIMIT-LOWER LIMIT)/3} | 50% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 40% |
| | | {LOWER LIMIT + (UPPER LIMIT-LOWER LIMIT) × 2/3} < AMBIENT TEMPERATURE ≤ UPPER LIMIT | 30% |
| | 30% < PRODUCTIVITY ≤ 70% | LOWER LIMIT ≤ AMBIENT TEMPERATURE ≤ {LOWER LIMIT + (UPPER LIMIT-LOWER LIMIT)/3} | 70% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 60% |
| | | {LOWER LIMIT + (UPPER LIMIT-LOWER LIMIT) × 2/3} < AMBIENT TEMPERATURE ≤ UPPER LIMIT | 50% |
| | 70% < PRODUCTIVITY ≤ 100% | LOWER LIMIT ≤ AMBIENT TEMPERATURE ≤ {LOWER LIMIT + (UPPER LIMIT-LOWER LIMIT)/3} | 90% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 80% |
| | | {LOWER LIMIT + (UPPER LIMIT-LOWER LIMIT) × 2/3} < AMBIENT TEMPERATURE ≤ UPPER LIMIT | 70% |
| REWRITING | 0% < PRODUCTIVITY ≤ 30% | LOWER LIMIT ≤ AMBIENT TEMPERATURE ≤ {LOWER LIMIT + (UPPER LIMIT-LOWER LIMIT)/3} | 40% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 30% |
| | | {LOWER LIMIT + (UPPER LIMIT-LOWER LIMIT) × 2/3} < AMBIENT TEMPERATURE ≤ UPPER LIMIT | 20% |
| | 30% < PRODUCTIVITY ≤ 70% | LOWER LIMIT ≤ AMBIENT TEMPERATURE ≤ {LOWER LIMIT + (UPPER LIMIT-LOWER LIMIT)/3} | 60% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 50% |
| | | {LOWER LIMIT + (UPPER LIMIT-LOWER LIMIT) × 2/3} < AMBIENT TEMPERATURE ≤ UPPER LIMIT | 40% |
| | 70% < PRODUCTIVITY ≤ 100% | LOWER LIMIT ≤ AMBIENT TEMPERATURE ≤ {LOWER LIMIT + (UPPER LIMIT-LOWER LIMIT)/3} | 80% |
| | | {LOWER LIMIT + (UPPER LIMIT-LOWER LIMIT)/3} < AMBIENT TEMPERATURE ≤ {LOWER | 70% |

TABLE 4-continued

| OPERATING MODES | PRODUCTIVITY | AMBIENT TEMPERATURE | FAN SPEED |
|---|---|---|---|
| IMAGE RECORDING | 0% < PRODUCTIVITY ≤ 30% | LIMIT + (UPPER LIMIT-LOWER LIMIT) × 2/3} | |
| | | {LOWER LIMIT + (UPPER LIMIT-LOWER LIMIT) × 2/3} < AMBIENT TEMPERATURE ≤ UPPER LIMIT | 60% |
| | | LOWER LIMIT ≤ AMBIENT TEMPERATURE ≤ {LOWER LIMIT + (UPPER LIMIT-LOWER LIMIT)/3} | 30% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 20% |
| | | {LOWER LIMIT + (UPPER LIMIT-LOWER LIMIT) × 2/3} < AMBIENT TEMPERATURE ≤ UPPER LIMIT | 10% |
| | 30% < PRODUCTIVITY ≤ 70% | LOWER LIMIT ≤ AMBIENT TEMPERATURE ≤ {LOWER LIMIT + (UPPER LIMIT-LOWER LIMIT)/3} | 50% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 40% |
| | | {LOWER LIMIT + (UPPER LIMIT-LOWER LIMIT) × 2/3} < AMBIENT TEMPERATURE ≤ UPPER LIMIT | 30% |
| | 70% < PRODUCTIVITY ≤ 100% | LOWER LIMIT ≤ AMBIENT TEMPERATURE ≤ {LOWER LIMIT + (UPPER LIMIT-LOWER LIMIT)/3} | 70% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 60% |
| | | {LOWER LIMIT + (UPPER LIMIT-LOWER LIMIT) × 2/3} < AMBIENT TEMPERATURE ≤ UPPER LIMIT | 50% |

TABLE 5

| OPERATING MODES | PRODUCTIVITY | AMBIENT TEMPERATURE | FAN SPEED |
|---|---|---|---|
| IMAGE ERASING | 0% < PRODUCTIVITY ≤ 30% | LOWER LIMIT ≤ AMBIENT TEMPERATURE ≤ {LOWER LIMIT + (UPPER LIMIT-LOWER LIMIT)/3} | 60% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 50% |
| | | {LOWER LIMIT + (UPPER LIMIT-LOWER LIMIT) × 2/3} < AMBIENT TEMPERATURE ≤ UPPER LIMIT | 40% |
| | 30% < PRODUCTIVITY ≤ 70% | LOWER LIMIT ≤ AMBIENT TEMPERATURE ≤ {LOWER LIMIT + (UPPER LIMIT-LOWER LIMIT)/3} | 80% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 70% |
| | | {LOWER LIMIT + (UPPER LIMIT-LOWER LIMIT) × 2/3} < AMBIENT TEMPERATURE ≤ UPPER LIMIT | 60% |

TABLE 5-continued

| OPERATING MODES | PRODUCTIVITY | AMBIENT TEMPERATURE | FAN SPEED |
|---|---|---|---|
| | 70% < PRODUCTIVITY ≤ 100% | LOWER LIMIT ≤ AMBIENT TEMPERATURE ≤ {LOWER LIMIT + (UPPER LIMIT-LOWER LIMIT)/3} | 100% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 90% |
| | | {LOWER LIMIT + (UPPER LIMIT-LOWER LIMIT) × 2/3} < AMBIENT TEMPERATURE ≤ UPPER LIMIT | 80% |
| REWRITING | 0% < PRODUCTIVITY ≤ 30% | LOWER LIMIT ≤ AMBIENT TEMPERATURE ≤ {LOWER LIMIT + (UPPER LIMIT-LOWER LIMIT)/3} | 50% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 40% |
| | | {LOWER LIMIT + (UPPER LIMIT-LOWER LIMIT) × 2/3} < AMBIENT TEMPERATURE ≤ UPPER LIMIT | 30% |
| | 30% < PRODUCTIVITY ≤ 70% | LOWER LIMIT ≤ AMBIENT TEMPERATURE ≤ {LOWER LIMIT + (UPPER LIMIT-LOWER LIMIT)/3} | 70% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 60% |
| | | {LOWER LIMIT + (UPPER LIMIT-LOWER LIMIT) × 2/3} < AMBIENT TEMPERATURE ≤ UPPER LIMIT | 50% |
| | 70% < PRODUCTIVITY ≤ 100% | LOWER LIMIT ≤ AMBIENT TEMPERATURE ≤ {LOWER LIMIT + (UPPER LIMIT-LOWER LIMIT)/3} | 90% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 80% |
| | | {LOWER LIMIT + (UPPER LIMIT-LOWER LIMIT) × 2/3} < AMBIENT TEMPERATURE ≤ UPPER LIMIT | 70% |
| IMAGE RECORDING | 0% < PRODUCTIVITY ≤ 30% | LOWER LIMIT ≤ AMBIENT TEMPERATURE ≤ {LOWER LIMIT + (UPPER LIMIT-LOWER LIMIT)/3} | 40% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 30% |
| | | {LOWER LIMIT + (UPPER LIMIT-LOWER LIMIT) × 2/3} < AMBIENT TEMPERATURE ≤ UPPER LIMIT | 20% |
| | 30% < PRODUCTIVITY ≤ 70% | LOWER LIMIT ≤ AMBIENT TEMPERATURE ≤ {LOWER LIMIT + (UPPER LIMIT-LOWER LIMIT)/3} | 60% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 50% |
| | | {LOWER LIMIT + (UPPER LIMIT-LOWER LIMIT) × 2/3} < AMBIENT TEMPERATURE ≤ UPPER LIMIT | 40% |
| | 70% < PRODUCTIVITY ≤ 100% | LOWER LIMIT ≤ AMBIENT TEMPERATURE ≤ {LOWER LIMIT + (UPPER LIMIT-LOWER LIMIT)/3} | 80% |
| | | {LOWER LIMIT + (UPPER LIMIT- | 70% |

TABLE 5-continued

| OPERATING MODES | PRODUCTIVITY | AMBIENT TEMPERATURE | FAN SPEED |
|---|---|---|---|
| | | LOWER LIMIT)/3} < AMBIENT TEMPERATURE ≤ {LOWER LIMIT + (UPPER LIMIT-LOWER LIMIT) × 2/3} | |
| | | {LOWER LIMIT + (UPPER LIMIT-LOWER LIMIT) × 2/3} < AMBIENT TEMPERATURE ≤ UPPER LIMIT | 60% |

In the present embodiment, the amount of heat in a laser light source increases in the order of the image recording mode, the rewriting mode, and the image erasing mode. That is, when the amount of heat in the laser light source in the image recording mode is E1, that of the rewriting mode is E2, and that of the image erasing mode is E3; E1, E2, and E3 satisfy the relations of E3>E2>E1. In each of the operating modes, as the productivity increases, the amount of heat in the laser light source increases. Further, as the ambient temperature decreases, the amount of heat in the laser light source increases. Further, as the temperature of the laser light source decreases, the amount of heat in the laser light source increases. A description is provided of an example of control of each operating mode.

In Table 4, the temperature of the laser light source is higher than or equal to the lower limit and lower than the value of {Lower Limit+(Upper Limit-Lower Limit)/2}.

[Image Erasing Mode]

In the case that the productivity is greater than 0% and less than or equal to 30%, when the relation of Lower Limit≤Ambient Temperature≤{Lower Limit+(Upper Limit-Lower Limit)/3} is satisfied, the fan speed corresponds to a rotation speed of 50% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 40% of the rated rotation speed. When the relation of {Lower Limit+(Upper Limit-Lower Limit)×2/3}<Ambient Temperature≤Upper Limit is satisfied, the fan speed corresponds to a rotation speed of 30% of the rated rotation speed.

In the case that the productivity is greater than 30% and less than or equal to 70%, when the relation of Lower Limit≤Ambient Temperature≤{Lower Limit+(Upper Limit-Lower Limit)/3} is satisfied, the fan speed corresponds to a rotation speed of 70% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 60% of the rated rotation speed. When the relation of {Lower Limit+(Upper Limit-Lower Limit)×2/3}<Ambient Temperature≤Upper Limit is satisfied, the fan speed corresponds to a rotation speed of 50% of the rated rotation speed.

In the case that the productivity is greater than 70% and less than or equal to 100%, when the relation of Lower Limit≤Ambient Temperature≤{Lower Limit+(Upper Limit-Lower Limit)/3} is satisfied, the fan speed corresponds to a rotation speed of 90% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 80% of the rated rotation speed. When the relation of {Lower Limit+(Upper Limit-Lower Limit)×2/3}<Ambient Temperature≤Upper Limit is satisfied, the fan speed corresponds to a rotation speed of 70% of the rated rotation speed.

[Rewriting Mode]

In the case that the productivity is greater than 0% and less than or equal to 30%, when the relation of Lower Limit≤Ambient Temperature≤{Lower Limit+(Upper Limit-Lower Limit)/3} is satisfied, the fan speed corresponds to a rotation speed of 40% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 30% of the rated rotation speed. When the relation of {Lower Limit+(Upper Limit-Lower Limit)×2/3}<Ambient Temperature≤Upper Limit is satisfied, the fan speed corresponds to a rotation speed of 20% of the rated rotation speed.

In the case that the productivity is greater than 30% and less than or equal to 70%, when the relation of Lower Limit≤Ambient Temperature≤{Lower Limit+(Upper Limit-Lower Limit)/3} is satisfied, the fan speed corresponds to a rotation speed of 60% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 50% of the rated rotation speed. When the relation of {Lower Limit+(Upper Limit-Lower Limit)×2/3}<Ambient Temperature≤Upper Limit is satisfied, the fan speed corresponds to a rotation speed of 40% of the rated rotation speed.

In the case that the productivity is greater than 70% and less than or equal to 100%, when the relation of Lower Limit≤Ambient Temperature≤{Lower Limit+(Upper Limit-Lower Limit)/3} is satisfied, the fan speed corresponds to a rotation speed of 80% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 70% of the rated rotation speed. When the relation of {Lower Limit+(Upper Limit-Lower Limit)×2/3}<Ambient Temperature≤Upper Limit is satisfied, the fan speed corresponds to a rotation speed of 60% of the rated rotation speed.

[Image Recording Mode]

In the case that the productivity is greater than 0% and less than or equal to 30%, when the relation of Lower Limit≤Ambient Temperature≤{Lower Limit+(Upper Limit-Lower Limit)/3} is satisfied, the fan speed corresponds to a rotation speed of 30% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 20% of the rated rotation speed. When the relation of {Lower Limit+(Upper Limit-Lower Limit)×2/

3}<Ambient Temperature≤Upper Limit is satisfied, the fan speed corresponds to a rotation speed of 10% of the rated rotation speed.

In the case that the productivity is greater than 30% and less than or equal to 70%, when the relation of Lower Limit≤Ambient Temperature≤{Lower Limit+(Upper Limit-Lower Limit)/3} is satisfied, the fan speed corresponds to a rotation speed of 50% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 40% of the rated rotation speed. When the relation of {Lower Limit+(Upper Limit-Lower Limit)×2/3}<Ambient Temperature≤Upper Limit is satisfied, the fan speed corresponds to a rotation speed of 30% of the rated rotation speed.

In the case that the productivity is greater than 70% and less than or equal to 100%, when the relation of Lower Limit≤Ambient Temperature≤{Lower Limit+(Upper Limit-Lower Limit)/3} is satisfied, the fan speed corresponds to a rotation speed of 70% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 60% of the rated rotation speed. When the relation of {Lower Limit+(Upper Limit-Lower Limit)×2/3}<Ambient Temperature≤Upper Limit is satisfied, the fan speed corresponds to a rotation speed of 50% of the rated rotation speed.

In Table 5, the temperature of the laser light source is higher than or equal to the value of {Lower Limit+(Upper Limit-Lower Limit)/2} and lower than or equal to the upper limit.

[Image Erasing Mode]

In the case that the productivity is greater than 0% and less than or equal to 30%, when the relation of Lower Limit≤Ambient Temperature≤{Lower Limit+(Upper Limit-Lower Limit)/3} is satisfied, the fan speed corresponds to a rotation speed of 60% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 50% of the rated rotation speed. When the relation of {Lower Limit+(Upper Limit-Lower Limit)×2/3}<Ambient Temperature≤Upper Limit is satisfied, the fan speed corresponds to a rotation speed of 40% of the rated rotation speed.

In the case that the productivity is greater than 30% and less than or equal to 70%, when the relation of Lower Limit≤Ambient Temperature≤{Lower Limit+(Upper Limit-Lower Limit)/3} is satisfied, the fan speed corresponds to a rotation speed of 80% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 70% of the rated rotation speed. When the relation of {Lower Limit+(Upper Limit-Lower Limit)×2/3}<Ambient Temperature≤Upper Limit is satisfied, the fan speed corresponds to a rotation speed of 60% of the rated rotation speed.

In the case that the productivity is greater than 70% and less than or equal to 100%, when the relation of Lower Limit≤Ambient Temperature≤{Lower Limit+(Upper Limit-Lower Limit)/3} is satisfied, the fan speed corresponds to a rotation speed of 100% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 90% of the rated rotation speed. When the relation of {Lower Limit+(Upper Limit-Lower Limit)×2/3}<Ambient Temperature≤Upper Limit is satisfied, the fan speed corresponds to a rotation speed of 80% of the rated rotation speed.

[Rewriting Mode]

In the case that the productivity is greater than 0% and less than or equal to 30%, when the relation of Lower Limit≤Ambient Temperature≤{Lower Limit+(Upper Limit-Lower Limit)/3} is satisfied, the fan speed corresponds to a rotation speed of 50% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 40% of the rated rotation speed. When the relation of {Lower Limit+(Upper Limit-Lower Limit)×2/3}<Ambient Temperature≤Upper Limit is satisfied, the fan speed corresponds to a rotation speed of 30% of the rated rotation speed.

In the case that the productivity is greater than 30% and less than or equal to 70%, when the relation of Lower Limit≤Ambient Temperature≤{Lower Limit+(Upper Limit-Lower Limit)/3} is satisfied, the fan speed corresponds to a rotation speed of 70% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 60% of the rated rotation speed. When the relation of {Lower Limit+(Upper Limit-Lower Limit)×2/3}<Ambient Temperature≤Upper Limit is satisfied, the fan speed corresponds to a rotation speed of 50% of the rated rotation speed.

In the case that the productivity is greater than 70% and less than or equal to 100%, when the relation of Lower Limit≤Ambient Temperature≤{Lower Limit+(Upper Limit-Lower Limit)/3} is satisfied, the fan speed corresponds to a rotation speed of 90% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 80% of the rated rotation speed. When the relation of {Lower Limit+(Upper Limit-Lower Limit)×2/3}<Ambient Temperature≤Upper Limit is satisfied, the fan speed corresponds to a rotation speed of 70% of the rated rotation speed.

[Image Recording Mode]

In the case that the productivity is greater than 0% and less than or equal to 30%, when the relation of Lower Limit≤Ambient Temperature≤{Lower Limit+(Upper Limit-Lower Limit)/3} is satisfied, the fan speed corresponds to a rotation speed of 40% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 30% of the rated rotation speed. When the relation of {Lower Limit+(Upper Limit-Lower Limit)×2/3}<Ambient Temperature≤Upper Limit is satisfied, the fan speed corresponds to a rotation speed of 20% of the rated rotation speed.

In the case that the productivity is greater than 30% and less than or equal to 70%, when the relation of Lower Limit≤Ambient Temperature≤{Lower Limit+(Upper Limit-Lower Limit)/3} is satisfied, the fan speed corresponds to a rotation speed of 60% of the rated rotation speed. When the relation of {Lower Limit+(Upper Limit-Lower Limit)/3}<Ambient Temperature≤{Lower Limit+(Upper Limit- Lower Limit)×2/3} is satisfied, the fan speed corresponds to a rotation speed of 50% of the rated rotation speed. When the relation of {Lower Limit+(Upper Limit-Lower Limit)×2/3}<Ambient Temperature≤Upper Limit is satisfied, the fan speed corresponds to a rotation speed of 40% of the rated rotation speed.

In the case that the productivity is greater than 70% and less than or equal to 100%, when the relation of Lower Limit≤Ambient Temperature≤{Lower Limit+(Upper Limit-Lower Limit)/3} is satisfied, the fan speed corresponds to a rotation speed of 80% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 70% of the rated rotation speed. When the relation of {Lower Limit+(Upper Limit-Lower Limit)×2/3}<Ambient Temperature≤Upper Limit is satisfied, the fan speed corresponds to a rotation speed of 60% of the rated rotation speed.

The cooling device according to the fourth embodiment changes a cooling performance according to the operating modes, productivity, ambient temperature of the image processing apparatus, and the temperature of the laser light source. With such a configuration, the laser light source maintains a permissible temperature without consuming an excessive amount of cooling energy.

Alternatively, in some embodiments, the cooling device exhibits a cooling performance that varies with the operating modes of the image processing apparatus and the temperature of the laser light source. Alternatively, in some embodiments, the cooling device exhibits a cooling performance that varies with the operating modes and productivity of the image processing apparatus, and the temperature of the laser light source. Alternatively, in some embodiments, the cooling device exhibits a cooling performance that varies with the operating modes, ambient temperature of the image processing apparatus, and the temperature of the laser light source.

Fifth Embodiment

In the third embodiment and the fourth embodiment, as the ambient temperature of the image processing apparatus decreases, the fan speed increases to enhance the cooling performance.

However, as the ambient temperature decreases, the cooling operation is more easily performed. When there are small differences in each of the thermal energies for developing a color (recording an image) and erasing a color (erasing an image) in a thermoreversible recording medium according to changes in temperature, it is possible to arrange matters such that the lower the ambient temperature, the lower the fan speed.

Figure 10:
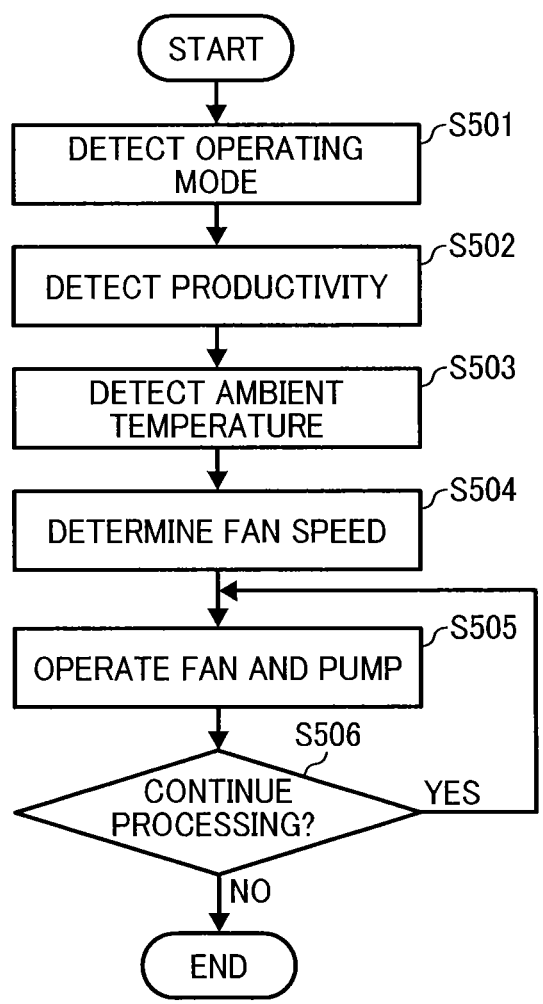
FIG. 10 is a flowchart of a cooling control process performed by a cooling device according to a fifth embodiment of the present disclosure.

FIG. 10 is a flowchart of a cooling control process performed by a second controller in a cooling device according to a fifth embodiment of the present disclosure.

A description is omitted of step S501 through step S506 of FIG. 10, which are the same as step 301 through step 306 of FIG. 8.

Table 6 shows the correspondence between the operating modes, productivity, and fan speed in step S505.

More specifically, Table 6 shows another example of the correspondence between operating modes, productivity, and fan speeds in step S304.

TABLE 6

| OPERATING MODES | PRODUCTIVITY | AMBIENT TEMPERATURE | FAN SPEED |
|---|---|---|---|
| IMAGE ERASING | 0% < PRODUCTIVITY ≤ 30% | LOWER LIMIT ≤ AMBIENT TEMPERATURE ≤ {LOWER LIMIT + (UPPER LIMIT-LOWER LIMIT)/3} | 40% |
| | | {LOWER LIMIT + (UPPER LIMIT-LOWER LIMIT)/3} < AMBIENT TEMPERATURE ≤ {(LOWER LIMIT + (UPPER LIMIT-LOWER LIMIT) × 2/3} | 50% |
| | | {LOWER LIMIT + (UPPER LIMIT-LOWER LIMIT) × 2/3} < AMBIENT TEMPERATURE ≤ UPPER LIMIT | 60% |
| | 30% < PRODUCTIVITY ≤ 70% | LOWER LIMIT ≤ AMBIENT TEMPERATURE ≤ {LOWER LIMIT + (UPPER LIMIT-LOWER LIMIT)/3} | 60% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 70% |
| | | {LOWER LIMIT + (UPPER LIMIT-LOWER LIMIT) × 2/3} < AMBIENT TEMPERATURE ≤ UPPER LIMIT | 80% |
| | 70% < PRODUCTIVITY ≤ 100% | LOWER LIMIT ≤ AMBIENT TEMPERATURE ≤ {LOWER LIMIT + (UPPER LIMIT-LOWER LIMIT)/3} | 80% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 90% |
| | | {LOWER LIMIT + (UPPER LIMIT-LOWER LIMIT) × 2/3} < AMBIENT TEMPERATURE ≤ UPPER LIMIT | 100% |

TABLE 6-continued

| OPERATING MODES | PRODUCTIVITY | AMBIENT TEMPERATURE | FAN SPEED |
|---|---|---|---|
| REWRITING | 0% < PRODUCTIVITY ≤ 30% | LOWER LIMIT ≤ AMBIENT TEMPERATURE ≤ {LOWER LIMIT + (UPPER LIMIT-LOWER LIMIT)/3} | 30% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 40% |
| | | {LOWER LIMIT + (UPPER LIMIT-LOWER LIMIT) × 2/3} < AMBIENT TEMPERATURE ≤ UPPER LIMIT | 50% |
| | 30% < PRODUCTIVITY ≤ 70% | LOWER LIMIT ≤ AMBIENT TEMPERATURE ≤ {LOWER LIMIT + (UPPER LIMIT-LOWER LIMIT)/3} | 50% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 60% |
| | | {LOWER LIMIT + (UPPER LIMIT-LOWER LIMIT) × 2/3} < AMBIENT TEMPERATURE ≤ UPPER LIMIT | 70% |
| | 70% < PRODUCTIVITY ≤ 100% | LOWER LIMIT ≤ AMBIENT TEMPERATURE ≤ {LOWER LIMIT + (UPPER LIMIT-LOWER LIMIT)/3} | 70% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 80% |
| | | {LOWER LIMIT + (UPPER LIMIT-LOWER LIMIT) × 2/3} < AMBIENT TEMPERATURE ≤ UPPER LIMIT | 90% |
| IMAGE RECORDING | 0% < PRODUCTIVITY ≤ 30% | LOWER LIMIT ≤ AMBIENT TEMPERATURE ≤ {LOWER LIMIT + (UPPER LIMIT-LOWER LIMIT)/3} | 20% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 30% |
| | | {LOWER LIMIT + (UPPER LIMIT-LOWER LIMIT) × 2/3} < AMBIENT TEMPERATURE ≤ UPPER LIMIT | 40% |
| | 30% < PRODUCTIVITY ≤ 70% | LOWER LIMIT ≤ AMBIENT TEMPERATURE ≤ {LOWER LIMIT + (UPPER LIMIT-LOWER LIMIT)/3} | 40% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 50% |
| | | {LOWER LIMIT + (UPPER LIMIT-LOWER LIMIT) × 2/3} < AMBIENT TEMPERATURE ≤ UPPER LIMIT | 60% |
| | 70% < PRODUCTIVITY ≤ 100% | LOWER LIMIT ≤ AMBIENT TEMPERATURE ≤ {LOWER LIMIT + (UPPER LIMIT-LOWER LIMIT)/3} | 60% |
| | | {LOWER LIMIT + (UPPER LIMIT-LOWER LIMIT)/3} < AMBIENT TEMPERATURE ≤ {LOWER LIMIT + (UPPER LIMIT-LOWER LIMIT) × 2/3} | 70% |
| | | {LOWER LIMIT + (UPPER LIMIT-LOWER LIMIT) × 2/3} < AMBIENT TEMPERATURE ≤ UPPER LIMIT | 80% |

[Image Erasing Mode]

In the case that the productivity is greater than 0% and less than or equal to 30%, when the relation of Lower Limit≤Ambient Temperature≤{Lower Limit+(Upper Limit-Lower Limit)/3} is satisfied, the fan speed corresponds to a rotation speed of 40% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 50% of the rated rotation speed. When the relation of {Lower Limit+(Upper Limit-Lower Limit)×2/3}<Ambient Temperature≤Upper Limit is satisfied, the fan speed corresponds to a rotation speed of 60% of the rated rotation speed.

In the case that the productivity is greater than 30% and less than or equal to 70%, when the relation of Lower Limit≤Ambient Temperature≤{Lower Limit+(Upper Limit-Lower Limit)/3} is satisfied, the fan speed corresponds to a rotation speed of 60% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 70% of the rated rotation speed. When the relation of {Lower Limit+(Upper Limit-Lower Limit)×2/3}<Ambient Temperature≤Upper Limit is satisfied, the fan speed corresponds to a rotation speed of 80% of the rated rotation speed.

In the case that the productivity is greater than 70% and less than or equal to 100%, when the relation of Lower Limit≤Ambient Temperature≤{Lower Limit+(Upper Limit-Lower Limit)/3} is satisfied, the fan speed corresponds to a rotation speed of 80% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 90% of the rated rotation speed. When the relation of {Lower Limit+(Upper Limit-Lower Limit)×2/3}<Ambient Temperature≤Upper Limit is satisfied, the fan speed corresponds to a rotation speed of 100% of the rated rotation speed.

[Rewriting Mode]

In the case that the productivity is greater than 0% and less than or equal to 30%, when the relation of Lower Limit≤Ambient Temperature≤{Lower Limit+(Upper Limit-Lower Limit)/3} is satisfied, the fan speed corresponds to a rotation speed of 30% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 40% of the rated rotation speed. When the relation of {Lower Limit+(Upper Limit-Lower Limit)×2/3}<Ambient Temperature≤Upper Limit is satisfied, the fan speed corresponds to a rotation speed of 50% of the rated rotation speed.

In the case that the productivity is greater than 30% and less than or equal to 70%, when the relation of Lower Limit≤Ambient Temperature≤{Lower Limit+(Upper Limit-Lower Limit)/3} is satisfied, the fan speed corresponds to a rotation speed of 50% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 60% of the rated rotation speed. When the relation of {Lower Limit+(Upper Limit-Lower Limit)×2/3}<Ambient Temperature≤Upper Limit is satisfied, the fan speed corresponds to a rotation speed of 70% of the rated rotation speed.

In the case that the productivity is greater than 70% and less than or equal to 100%, when the relation of Lower Limit≤Ambient Temperature≤{Lower Limit+(Upper Limit-Lower Limit)/3} is satisfied, the fan speed corresponds to a rotation speed of 70% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 80% of the rated rotation speed. When the relation of {Lower Limit+(Upper Limit-Lower Limit)×2/3}<Ambient Temperature≤Upper Limit is satisfied, the fan speed corresponds to a rotation speed of 90% of the rated rotation speed.

[Image Recording Mode]

In the case that the productivity is greater than 0% and less than or equal to 30%, when the relation of Lower Limit≤Ambient Temperature≤{Lower Limit+(Upper Limit-Lower Limit)/3} is satisfied, the fan speed corresponds to a rotation speed of 20% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 30% of the rated rotation speed. When the relation of {Lower Limit+(Upper Limit-Lower Limit)×2/3}<Ambient Temperature≤Upper Limit is satisfied, the fan speed corresponds to a rotation speed of 40% of the rated rotation speed.

In the case that the productivity is greater than 30% and less than or equal to 70%, when the relation of Lower Limit≤Ambient Temperature≤{Lower Limit+(Upper Limit-Lower Limit)/3} is satisfied, the fan speed corresponds to a rotation speed of 40% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 50% of the rated rotation speed. When the relation of {Lower Limit+(Upper Limit-Lower Limit)×2/3}<Ambient Temperature≤Upper Limit is satisfied, the fan speed corresponds to a rotation speed of 60% of the rated rotation speed.

In the case that the productivity is greater than 70% and less than or equal to 100%, when the relation of Lower Limit≤Ambient Temperature≤{Lower Limit+(Upper Limit-Lower Limit)/3} is satisfied, the fan speed corresponds to a rotation speed of 60% of the rated rotation speed. When the relation of {Lower Limit+(Upper Limit-Lower Limit)/3}<Ambient Temperature≤{Lower Limit+(Upper Limit-Lower Limit)×2/3} is satisfied, the fan speed corresponds to a rotation speed of 70% of the rated rotation speed. When the relation of {Lower Limit+(Upper Limit-Lower Limit)×2/3}<Ambient Temperature≤Upper Limit is satisfied, the fan speed corresponds to a rotation speed of 80% of the rated rotation speed.

The cooling device according to the fifth embodiment changes a cooling performance according to the operating modes, productivity, and ambient temperature (the temperature of the thermoreversible recording medium) of the image processing apparatus. Particularly, as the ambient temperature is lower, the fan speed is set lower. With such a configuration, the laser light source maintains a permissible temperature without consuming an excessive amount of cooling energy.

Sixth Embodiment

Figure 11:
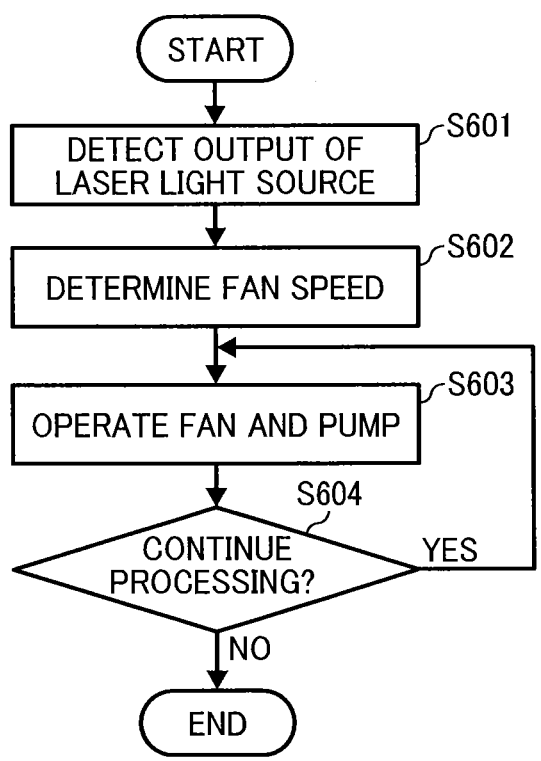
FIG. 11 is a flowchart of a cooling control process performed by a cooling device according to a sixth embodiment of the present disclosure.

FIG. 11 is a flowchart of a cooling control process performed by a second controller in a cooling device according to a sixth embodiment of the present disclosure. In the embodiments described above, the cooling device first detects an operating mode of an image processing apparatus. In contrast, the cooling device according to the present embodiment is controlled based on a predetermined value of output of a laser light source for each operating mode in the image processing apparatus.

The cooling device starts operating at the start of processing of an image processing apparatus. The cooling device first detects the amount of output of the laser light source in a step for detecting laser light source output (S601) (hereinafter, referred to simply as step S601).

Subsequently, in a step for determining the speed of a fan (602) (hereinafter, referred to as step S602), the cooling device determines the speed of the fan according to the detection result of step S601.

Following step S603, the cooling device starts operating the fan and pump in a step for operating fan and pump (S603) (hereinafter, referred to as step S603). In this case, the fan applies the speed, which has been determined in step S602.

Next, in a step for judging whether to continue processing (S604), the cooling device judges whether to continue the processing of the image processing apparatus. When an affirmative judgment is made (Yes) in step S604, the process goes to a step for operating fan and pump (S603). When a negative judgment is made (No) in step S604, the process goes to "END" to stop operating the fan and pump.

In the present embodiment, the amount of output of the laser light source increases in the order of the image recording mode, the rewriting mode, and the image erasing mode. That is, when the amount of heat in the laser light source in the image recording mode is P1, that of the rewriting mode is P2, and that of the image erasing mode is P3; P1, P2, and P3 satisfy the relations of P3>P2>P1.

In the present embodiment, as the amount of the laser light source is greater, the fan speed is set faster. For example, the fan speed in the image erasing mode is a rated rotation speed (R), the fan speed in the rewriting mode is expressed by the formula: R×P2/P3, and the fan speed in the image recording mode is expressed by the formula: R×P1/P3.

The cooling device according to the present embodiment changes a cooling performance according to the operating modes of the image processing apparatus. With such a configuration, the laser light source maintains a permissible temperature without consuming an excessive amount of cooling energy. In addition, as the cooling device changes the cooling performance according to the amount of output of the laser light source, the cooling performance of the cooling device can be determined according to the operating modes without sensors employed, thus allowing a simple configuration.

Although the embodiments of the present disclosure have been described above, the present disclosure is not limited to the embodiments described above, and a variety of modifications can naturally be made within the scope of the present disclosure.

The image processing apparatus including the cooling device according to the embodiments of the present disclosure saves energy for cooling the laser light source, maintaining the laser light source at the optimal temperature.

According to the present embodiments, the present disclosure is applied to an image processing apparatus as an example of the laser device to irradiate a medium with a laser beam. However, the image processing apparatus is not limited thereto.

Moreover, the present disclosure can be applied to an image forming apparatus as another example of a laser device.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A cooling device to cool a laser light source of a laser device to irradiate a medium with a laser beam, the cooling device comprising:
    a cooling controller to control a cooling operation of the cooling device according to data associated with a heating state of the laser device obtained without employment of a sensor; and
    a fan, operatively connected to the cooling controller, to cool the laser light source, wherein
    the laser device is an image forming apparatus having at least two operating modes of
        a first operating mode to irradiate a thermoreversible recording medium with a laser beam to record an image thereon;
        a second operating mode to irradiate a thermoreversible recording medium with a laser beam to erase an image therefrom; and
        a third operating mode to irradiate a thermoreversible recording medium having a recorded image with a laser beam to erase the recorded image and record another image thereon,
    the cooling controller
        controls the cooling operation of the cooling device according to the at least two operating modes;
        controls a rotation speed of the fan;
        controls the cooling operation of the cooling device according to productivity of the image processing apparatus; and
        controls the cooling operation of the cooling device according to ambient temperature of the image processing apparatus,
    each of the at least two operating modes includes at least two productivity ranges,
    each of the at least two productivity ranges includes at least two ambient temperature ranges, and
    the rotation speed of the fan for one of the at least two ambient temperature ranges of one of the at least two productivity ranges is controlled to be the same as for one of the at least two ambient temperature ranges of the other of the at least two productivity ranges.

2. The cooling device according to claim 1, wherein the cooling controller controls the rotation speed of the fan in the third operating mode to be slower than the rotation speed of the fan in the second operating mode and faster than the rotation speed of the fan in the first operating mode.

3. The cooling device according to claim 1, further comprising a pump to deliver a coolant to cool the laser light source, wherein
    the cooling controller controls the fan and the pump.

4. The cooling device according to claim 1, wherein the cooling controller further controls the cooling operation according to a temperature of the laser light source of the image processing apparatus.

5. The cooling device according to claim 1, wherein the cooling controller controls the rotation speed of the fan to increase as the ambient temperature decreases.

6. The cooling device according to claim 1, wherein the cooling controller controls the rotation speed of the fan to decrease as the ambient temperature decreases.

7. The cooling device according to claim 1, wherein
a first rotation speed of the fan for a first of three ambient temperature ranges of a first of three productivity ranges is controlled to be the same as for a first of three temperature ranges of a second of the three productivity ranges, and
a second rotation speed of the fan for a second of the three temperatures ranges of the second of the three productivity ranges is controlled to be the same as a first of three temperature ranges of a third of the three productivity ranges.

8. A laser device, comprising:
a laser light source to emit a laser beam;
a cooling device to cool the laser light source;
a cooling controller to control a cooling operation of the cooling device according to data associated with a heating state of the laser light source obtained without employment of a sensor; and
a fan, operatively connected to the cooling controller, to cool the laser light source, wherein
the laser device is an image forming apparatus having at least two operating modes of
a first operating mode to irradiate a thermoreversible recording medium with a laser beam to record an image thereon;
a second operating mode to irradiate a thermoreversible recording medium with a laser beam to erase an image therefrom; and
a third operating mode to irradiate a thermoreversible recording medium having a recorded image with a laser beam to erase the recorded image and record another image thereon,
the cooling controller
controls the cooling operation of the cooling device according to the at least two operating modes;
controls a rotation speed of the fan,
controls the cooling operation of the cooling device according to productivity of the image processing apparatus; and
controls the cooling operation of the cooling device according to ambient temperature of the image processing apparatus,
each of the at least two operating modes includes at least two productivity ranges,
each of the at least two productivity ranges includes at least two ambient temperature ranges, and
the rotation speed of the fan for one of the at least two ambient temperature ranges of one of the at least two productivity ranges is controlled to be the same as for one of the at least two ambient temperature ranges of the other of the at least two productivity ranges.

9. The laser device according to claim 8, wherein the same laser light source is used by the laser device for the at least two operating modes.

10. An image processing apparatus, comprising:
a laser light source in a laser device to emit a laser beam;
a cooling device to cool the laser light source;
a cooling controller to control a cooling operation of the cooling device according to data associated with a heating state of the laser light source obtained without employment of a sensor; and
a fan, operatively connected to the cooling controller, to cool the laser light source, wherein
the image processing apparatus has at least two operating modes of:
a first operating mode to irradiate a thermoreversible recording medium with a laser beam to record an image thereon;
a second operating mode to irradiate a thermoreversible recording medium with a laser beam to erase an image therefrom; and
a third operating mode to irradiate a thermoreversible recording medium having an image recorded with a laser beam to erase the recorded image and record another image thereon,
the cooling controller
controls the cooling operation of the cooling device according to the at least two operating modes;
controls a rotation speed of the fan,
controls the cooling operation of the cooling device according to productivity of the image processing apparatus; and
controls the cooling operation of the cooling device according to ambient temperature of the image processing apparatus,
each of the at least two operating modes includes at least two productivity ranges,
each of the at least two productivity ranges includes at least two ambient temperature ranges, and
the rotation speed of the fan for one of the at least two ambient temperature ranges of one of the at least two productivity ranges is controlled to be the same as for one of the at least two ambient temperature ranges of the other of the at least two productivity ranges.

* * * * *